(12) United States Patent
Van Der Vleuten et al.

(10) Patent No.: US 6,289,306 B1
(45) Date of Patent: Sep. 11, 2001

(54) DATA PROCESSING OF A BITSTREAM SIGNAL

(75) Inventors: Renatus J. Van Der Vleuten; Alphons A. M. L. Bruekers; Arnoldus W. J. Oomen, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 08/966,375

(22) Filed: Nov. 7, 1997

(30) Foreign Application Priority Data

Nov. 7, 1996 (EP) .................................................. 96203105
Jun. 4, 1997 (EP) .................................................. 97201680

(51) Int. Cl.[7] ................................ G10L 3/02; G10L 9/00; H03M 7/32; H04L 7/00
(52) U.S. Cl. ......................... 704/219; 704/211; 704/212; 341/76; 341/77; 371/41; 371/42
(58) Field of Search ..................................... 704/219, 211, 704/212, 500, 501; 341/143, 76, 77, 139; 375/247, 27, 28, 241–245; 371/53, 54

(56) References Cited

U.S. PATENT DOCUMENTS 4,905,002 * 2/1990 Jones et al. ............................. 341/77
5,621,760 4/1997 Gotoh et al. .......................... 375/245
5,862,153 * 1/1999 Kikuchi et al. ........................ 371/42

OTHER PUBLICATIONS

Parsons, Thomas W., Speech Processing, McGraw Hill, pp 239–241, Dec. 1987.*

* cited by examiner

Primary Examiner—David D. Knepper
Assistant Examiner—Robert Louis Sax
(74) Attorney, Agent, or Firm—Michael E Belk

(57) ABSTRACT

A data processing apparatus includes an input terminal for receiving an audio signal, a 1-bit A/D converter for A/D converting the audio signal so as to obtain a bitstream signal, and a prediction unit for carrying out a prediction step on the bitstream signal so as to obtain a predicted bitstream signal. The data processing apparatus further includes a signal combination unit for combining the bitstream signal and the predicted bitstream signal so as to obtain a residue bitstream signal, and an output terminal for supplying the residual bitstream signal. A recording apparatus or a transmitter apparatus can use the data processing apparatus.

37 Claims, 9 Drawing Sheets

DATA PROCESSING OF A BITSTREAM SIGNAL

FIELD OF THE INVENTION

BACKGROUND OF THE INVENTION

The invention relates to: a data processing apparatus for data processing an audio signal, to a data processing method, a transmitter comprising the data processing apparatus, a transmitter in the form of a recording apparatus, a record carrier, to second data processing apparatus for reconverting an input signal into a replica of the audio signal, to a receiver including the second data processing apparatus, and to a receiver in the form of a reproducing apparatus and to a transmission signal including a data compressed residual bitstream signal.

Data processing an audio signal is well known in the art. Reference is made in this respect to EP-A 402,973, document D1. The document describes a subband coder, in which an audio signal is A/D converted with a specific sampling frequency, such as 44.1 kHz, and the resulting samples in the form of eg. 24 bits wide words of the audio signal, are supplied to a subband splitter filter. The subband splitter filter splits the wideband digital audio signal into a plurality of relatively narrow band subband signals. Using a psycho acoustic model, a masked threshold is derived and blocks of samples of the subband signals are subsequently quantised with a specific number of bits per sample for each block of the subband signals, in response to the masked threshold, resulting in a significant data compression of the audio signal to be transmitted. The data compression carried out is based on 'throwing away' those components in the audio signal that are inaudible and is thus a lossy compression method. The data compression described in document D1 is a rather intelligent data compression method and requires a substantial number of gates or instructions, when implemented in hardware or software respectively, so that it is expensive. Moreover, the subsequent expansion apparatus also requires a substantial number of gates or instructions, when realized in hardware or software respectively. Those skilled in the art are directed to: "A digital decimating filter for analog-to-digital conversion of hi-fi audio signals", by J. J. van der Kam in Philips Techn. Rev. 42, no. 6/7, April 1986, pp. 230–8, document D2; "A higher order topology for interpolative modulators for oversampling A/D converters", by Kirk C. H. Chao et al in IEEE Trans. on Circuits and Systems, Vol 37, no. 3, March 1990, pp. 309–18, document D3; "A method for the construction of minimum-redundancy codes", by D. A. Huffman in Proc. of the IRE, Vol. 40(10), September 1952, document D4; "An introduction to arithmetic coding" by G. G. Langdon, IBM J. Res. Develop., Vol. 28(2), March 1984, document D5; "A universal algorithm for sequential data compression" by J. Ziv et al, IEEE Trans. on Inform. Theory, Vol. IT-23, 1977, document D6; EP patent application no. 96202807.2, filing date Oct. 10, 1996 (PHN 16.029), document D7.

The above citations are hereby incorporated in whole by reference.

SUMMARY OF THE INVENTION

The invention aims at providing a data processing apparatus for processing an audio signal such that it can be data compressed by a lossless coder in a relatively simple way. Further, the invention aims at providing a corresponding data processing apparatus for reconverting the processed bitstream signal into a replica of the audio signal.

The data processing apparatus in accordance with the invention includes input apparatus for receiving the audio signal, conversion apparatus for carrying out a conversion on the audio signal so as to obtain a 1-bit bitstream signal, the conversion means includes sigma-delta modulator means, prediction apparatus for carrying out a prediction step on a signal so as to obtain a predicted bitstream signal, signal combination apparatus for combining the bitstream signal and the predicted bitstream signal so as to obtain a residual bitstream signal, and output apparatus for supplying the residual bitstream signal.

The invention is based on the following recognition. Bitstream signals take up a considerable amount of capacity. To illustrate this: in a current proposal for a new standard for an optical audio disk, the disk will contain two channels of bitstream converted audio signals, sampled at $64.f_s$, where $f_s=44.1$ kHz. This corresponds to a rate four times higher than a current CD audio disk. As discussed in an earlier filed but not yet published patent application no. 96202807.2 in the name of applicant, document D7, already low complexity lossless coding algorithms, such as fixed Huffman table coding, are able to reduce this capacity to a certain extent. Experiments have revealed that even higher lossless compression ratios can be obtained using more sophisticated, more complex algorithms, such as Lempel-Ziv.

Mainly in audio/speech coding, linear prediction is known to be a powerful technique. By removing redundancy from a speech/audio signal prior to quantization, the entropy of signal after quantization can be significantly reduced. The signals at the input and output of a predictor are either in a floating point or a multi bit representation.

In lossless coding of bitstream signals, the complexity of the algorithm, especially at the decoder side is of importance. However, generally, the performance of the lossless coding algorithm is closely related to its complexity.

In accordance with the invention, prediction is used on bitstream signals. ie. signals with only two different representation symbols, either '0' or '1'. This has the advantage of an increase of lossless compression performance, for only a marginal extra complexity.

Experiments have revealed that even a third order prediction has considerable effect on the statistics of the resulting signal. By means of prediction already, as a preprocessing step, prior to data compression, the probability of a '1'-bit can be brought down from 50% to about 20%. The effect of this is that the output of the apparatus in accordance with the invention contains long runs of 'zeroes', which can be exploited by simple Huffman coding or run-length coding.

The audio signal can be applied in analog form or in digital form. When AID converting, in accordance with the invention, an analog audio signal with a 1-bit A/D converter (also named: bitstream converter or sigma-delta modulator), the audio signal to be A/D converted is sampled with a frequency which is generally a multiple of the frequency of 44.1 kHz or 48 kHz. The output signal of the 1-bit A/D converter is a binary signal, named bitstream signal. When the audio signal is supplied in digital form, sampled at eg. 44.1 kHz, the samples being expressed in eg. 16 bits per sample, this digital audio signal is oversampled with a frequency which is again a multiple of this sampling frequency of 44.1 kHz (or 48 kHz), which results in the 1-bit bitstream signal.

Converting an audio signal into a 1-bit bitstream signal has a number of advantages. Bitstream conversion is a high quality encoding method, with the possibility of a high quality decoding or a low quality decoding with the further advantage of a simpler decoding circuit. Reference is made in this respect to the publications "A digital decimating filter for analog-to-digital conversion of hi-fi audio signals", by J. J. van der Kam, document D2 above, and "A higher order topology for interpolative modulators for oversampling A/D converters", by Kirk C. H. Chao et al, document D3 in the 1-bit D/A converters are used in CD players, as an example, to reconvert the bitstream audio signal into an analog audio signal. The audio signal recorded on a CD disk is however not data compressed, prior to recording on the disk.

It is well known in the art that the resulting bitstream signal of the 1-bit A/D converter is, roughly, a random signal which has a 'noisy-like' frequency spectrum. Such types of signals are hard to data compress.

Surprisingly, however, it was established that by applying a prediction step, prior to data compression, eg. using a lossless coder, a significant data reduction could be obtained, in spite of the noisy character of the bitstream signal from the 1-bit A/D converter.

Those skilled in the art will understand the invention and additional objects and advantages of the invention by studying the description of preferred embodiments below with reference to the following drawings which illustrate the features of the appended claims:

BRIEF DESCRIPTION OF THE DRAWINGS

FIG. 20, illustrates details of a example prediction unit.

DETAILED DESCRIPTION OF THE PREFERRED EMBODIMENT

Figure 1:
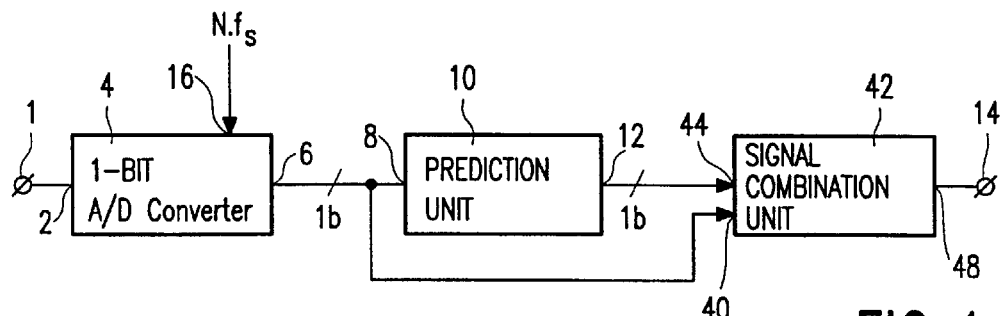
FIG. 1 shows an embodiment of the data processing apparatus.

FIG. 1 shows an embodiment of the data processing apparatus in accordance with the invention, including an input terminal 1 for receiving the audio signal. In the present example, the audio signal is an analog audio signal. The input terminal 1 is coupled to an input 2 of a 1-bit A/D converter 4, also called: sigma-delta modulator. An output 6 of the 1-bit A/D converter 4 is coupled to an input 8 of a prediction unit 10 as well as to a first input 40 of a signal combination unit 42. An output 12 of the prediction unit 10 is coupled to a second input 44 of the signal combination unit 42, an output 48 of which is coupled to an output terminal 14.

The 1-bit A/D converter 4 is adapted to carry out a 1-bit A/D conversion on the audio signal so as to obtain a bitstream signal which is supplied to the output 6. To that purpose, the A/D converter 4 receives a sampling frequency equal to $N.f_s$ via an input 16. $f_s$ is a frequency equal to eg. 32 kHz, 44.1 kHz or 48 kHz and N is a large number, such as 64. The audio signal is sampled in the A/D converter 4 with a sampling frequency of eg. 2.8224 MHz (64×44.1 kHz). The bitstream signal appearing at the output 6 of the A/D converter, thus has a bitrate of 2.8224 MHz.

The prediction means 10 are adapted to carry out a prediction step on the bitstream signal applied to its input 8 so as to obtain a predicted bitstream signal at its output 12. The signal combination means 42 is adapted to combine the bitstream signal applied to its input 40 and the predicted bitstream signal applied to its input 44 so as to obtain a residue bitstream signal which is supplied to its output 14.

Figure 17A:
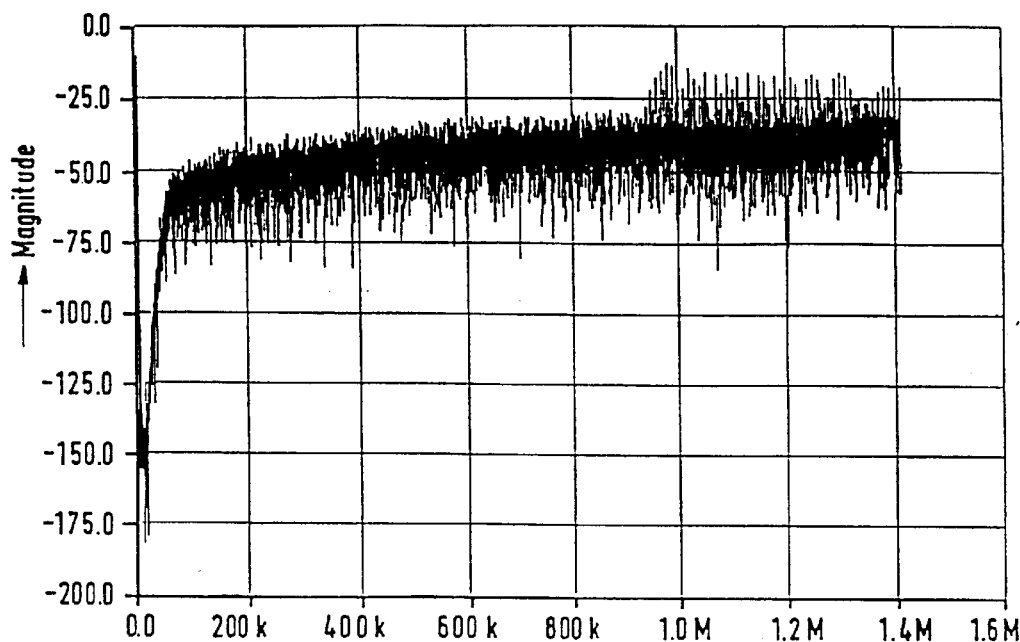
FIG. 17a shows the frequency spectrum of the output signal of the 1-bit A/D converter of FIG. 1.
Figure 17B:
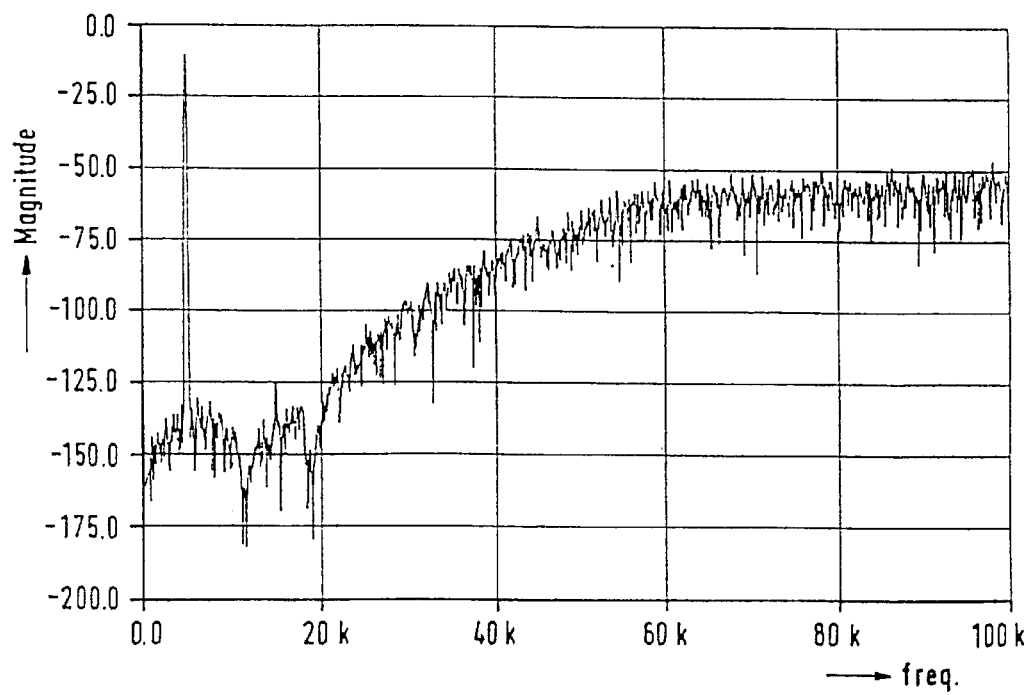
FIG. 17b shows the frequency spectrum of the same output signal in a smaller frequency range.

FIG. 17a shows a frequency spectrum of the bitstream signal present at the output 6 of the A/D converter 4, for an input signal in the form of a 5 kHz sinusoid, sampled with a sampling frequency of 2.8224 MHz. The spectrum thus shows frequencies between 0 Hz and 1.4 MHz. FIG. 17b shows part of the spectrum shown in FIG. 17a, namely that part between 0 Hz and 100 kHz, so as to more clearly show the 5 kHz sinusoid contained in the bitstream signal. Clearly visible is the noise-like character of the bitstream signal, especially in the higher frequency region. This seems to imply that carrying out a prediction step on the said signal, with a subsequent signal combination of the predicted version of the bitstream signal and the bitstream signal so as to obtain the residual signal will not result in a substantial decrease in entropy of the residual signal. Such decrease of entropy of the residual signal, compared to the input signal of the prediction unit being the general aim of a prediction unit.

Contrary to this, investigations have made clear that a significant decrease in entropy of the residual bitstream signal can be obtained by carrying out a prediction step, in spite of the noisy-like character of the bitstream signal.

The prediction unit 10 can have any form, and could include a FIR filter or an IIR filter. The coefficients of the filter are chosen (or derived) such, that, the output signal of the prediction unit 10 is the predicted version of the bitstream signal.

Figure 2:
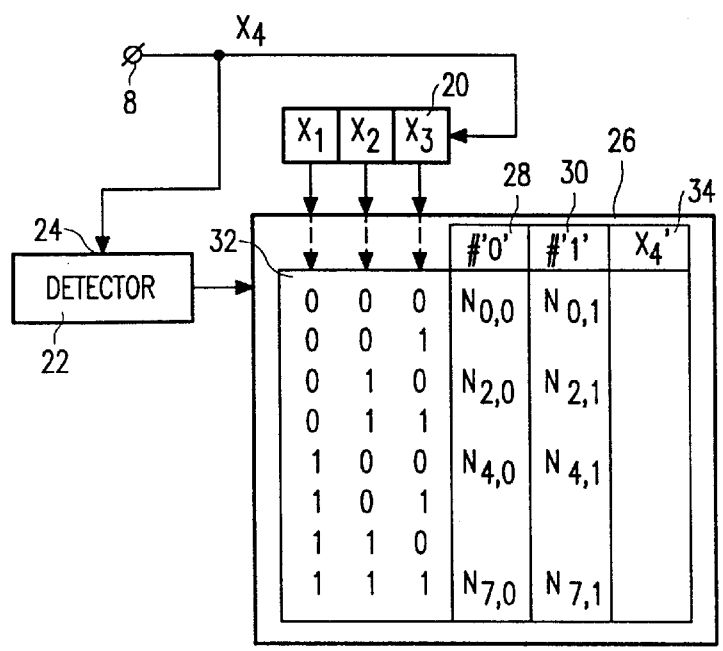
FIG. 2 shows part of an embodiment of a prediction unit for use in the apparatus of FIG. 1.

Another embodiment of the prediction unit 10 will be further explained with reference to FIGS. 2 and 3. FIG. 2 shows a part of the prediction unit 10, which includes a three bit shift register 20 having an input coupled to the input 8 of the prediction unit 10. Upon the application of three clock pulses (not shown) to the shift register 20, three subsequent bits $x_1, x_2, x_3$ of the bitstream signal applied to the input 8 are shifted into the shift register 20. A detector 22 is present having an input 24 coupled to the input 8 of the prediction unit 10. The detector detects the bit, value of the next bit, $x_4$ directly following the three subsequent bits $x_1, x_2, x_3$ in the bitstream signal. Further, a counter 26 is present which counts the number of times that a '0' bit follows a specific three bit bit sequence $x_1, x_2, x_3$ and the number of times that a '1' bit follows that same specific three bit bit sequence. This is done for all the eight possible 3-bit bit sequences $x_1, x_2, x_3$.

Explained in a different way. Assume that the three bit sequence '100' is stored in the shift register 20 and that the detector 24 detects the next bit $x_4$ to be '0'. As a result, the number $N_{4,0}$ in the column 28 is increased by one. Upon the next clock pulse applied to the shift register 20, the 3-bit word stored in the shift register 20 now equals '000'. Assume that the next bit $x_4$ now equals '1'. As a result, the number $N_{0,1}$ in the column 30 is increased by one.

This procedure is continued for a relatively large portion of the bitstream signal. When the portion of the bitstream signal has been processed in this way, the columns 28 and 29 are filled with numbers $N_{i,0}, N_{i,1}$. These which indicate the number of occurrences of a '0'-bit or '1'-bit respectively as the next bit following the i-th 3-bit sequence given in column 32, where i runs from 0 to 7 in the present example.

Next, a predicted binary value $X_4'$ is derived from the numbers in the columns 28 and 30 for each of the 3-bit sequences $x_1, x_2, x_3$ in the column 32. This is done by taking that binary value (either '0' or '1') that resulted in the highest of the count number $N_{i,0}$ and $N_{i,1}$ for the i-th bit sequence in column 32. As an example, if $N_{4,0}$ equals 78 and $N_{4,1}$ equals 532, the predicted bit $x_4'$ in response to the occurrence of the 3-bit bit, sequence '100' is chosen to be '1'. A conversion table can thus be derived including the columns 32 and 34, so that for each of the eight possible 3-bit sequences stored in the shift register 20, a corresponding predicted bit $x_4'$ can be generated. In the situation where equal count values $N_{i,0}$ and $N_{i,1}$ have been derived for a three bit bitsequence i, one can choose one of the two binary values '0' or '1' at random, as the value for the predicted bit.

It should be noted here, that two counters for each 3-bit, bit combination are used to count the numbers of 'zeroes' and 'ones' following said 3-bit, bit combination. Alternatively, one could use only one counter which is capable of counting up upon the occurrence of a 'zero' bit following the 3-bit, bit combination and counting down in response to the occurrence of a 'one' bit following the 3-bit bit combination. If the count value at the end of the test procedure is higher than at the beginning of the test procedure, the predicted bit will be chosen to be 'zero'. If the count value appears to be lower than the count value at the beginning of the test procedure, the predicted bit will be chosen to be 'one'.

If the signal to be processed is substantially time invariant, it may occur that, upon deriving a conversion table from a next portion of the bitstream signal, the same predicted values $X_4'$ will be obtained. In such case, it suffices to derive the conversion table once. For bitstream signals having varying properties, it may be required to each time derive the conversion table from a subsequent portion of the bitstream signal and then to predict that portion of the bitstream using its own derived conversion table.

Figure 3:
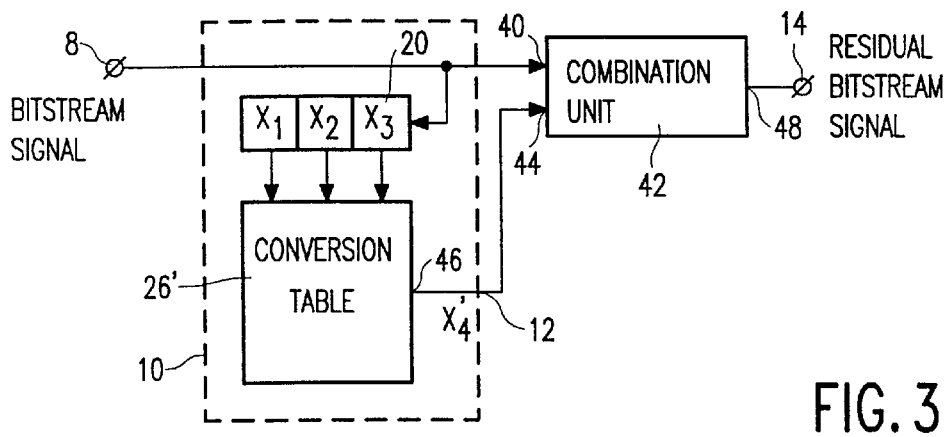
FIG. 3 shows an embodiment of the prediction unit and the signal combination unit incorporated in the data processing apparatus of FIG. 1.

FIG. 3 shows a further elaborated version of the prediction unit 10 together with the signal combination unit 42. The input 8 of the prediction unit 10 is coupled to a first input 40 of a signal combination unit 42. An output 46 of the conversion apparatus 26', which includes the conversion table derived as explained above with reference to FIG. 2, is coupled to a second input 44 of the signal combination unit 42. An output 48 of the signal combination unit is coupled to the output 14 of the data processing apparatus. The signal combination unit 42 can be in the form of an EXOR, or the combination unit 42 may be of a different construction, such as an EXNOR.

In response to a 3-bit bit sequence $x_1, x_2, x_3$ stored in the shift register 20, the conversion unit 26' supplies the bit $x_4'$ at its output 46. This bit $X_4'$ is a prediction of the bit $x_4$ present at the inputs of the shift register 20 and the combination unit 42. The combination unit 42 combines the bits $x_4$ and $x_4'$ so as to obtain a residual bit. Upon a subsequent clock signal (not shown) the bit $x_4$ present at the input of the shift register 20 is shifted into the shift register 20, so that a new 3-bit, bit sequence is stored in the shift register 20. The conversion unit 26' generates a new prediction bit $X_4'$ in response to this new 3-bit bit sequence stored in the shift register 20. The signal combination unit 42 combines this new prediction bit $x_4'$ with the new bit $x_4$ now present at the input 40, so as to obtain a new residual bit. In this way, a residual bitstream signal is obtained.

Assume that the combination unit 42 is an EXOR, the residual signal has the following property. Assume that both the bits $x_4$ and $X_4'$ are the same, that is, either '0' or '1'. The residual bit supplied by the EXOR is '0'. Assume now that the bits $x_4$ and $x_4'$ are not equal to each other. As a result, a '1' bit is generated as a residual bit by the EXOR 42. The occurrence of the '1' bits in the residual signal are thus a measure for the errors between the predicted bitstream signal applied to the input 44 of the combination unit 42 and the bitstream signal applied to the input 40.

Figure 4:
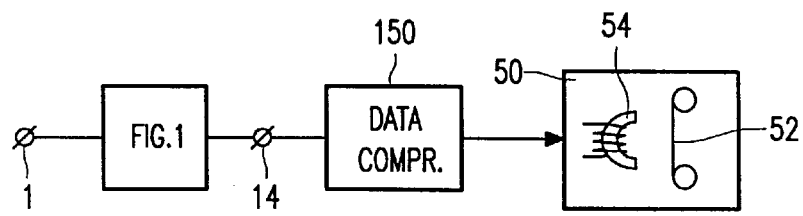
FIG. 4 shows the data processing apparatus of FIG. 1 incorporated in a recording apparatus for recording the residual bitstream signal on a record carrier.

FIG. 4 shows an embodiment of a recording apparatus including the data processing apparatus shown in FIG. 1, which may include the prediction unit shown in FIG. 3. The recording apparatus further includes a data compression unit 150 for data compressing the residual bitstream signal into a data compressed residual bitstream signal and a write unit 50 for writing the data compressed residual bitstream signal in a track on the record carrier 52. In the present example, the record carrier 52 is a magnetic record carrier, so that the write unit 50 includes at least one magnetic head 54 for writing the residual bitstream signal in the record carrier 52. The record carrier may however be an optical record carrier, such as a CD disk or a DVD disk.

Figure 5:
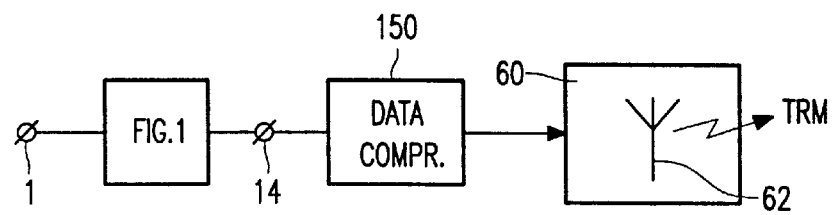
FIG. 5 shows the data processing apparatus of FIG. 1 incorporated in a transmission apparatus for transmitting the residual bitstream signal via a transmission medium.

FIG. 5 shows an embodiment of a transmitter for transmitting an audio signal via a transmission medium TRM, such as the data processing apparatus as shown in FIG. 1, which may also include the prediction unit shown in FIG. 3. The transmitter again includes the data compression unit 150 and further includes a transmission unit 60 for applying the data compressed residual bitstream signal to the transmission medium TRM. The transmission unit 60 could include an antenna 62.

Figure 6:
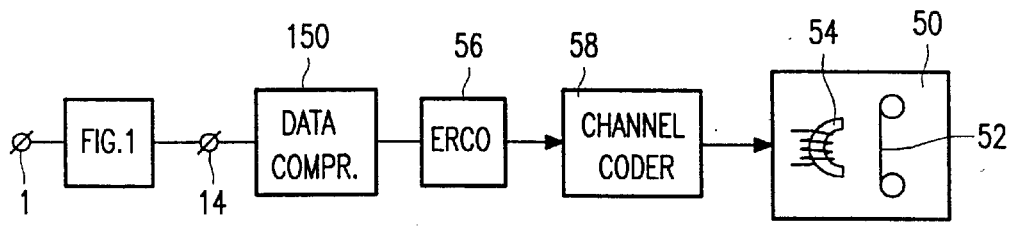
FIG. 6 shows a further embodiment of the recording apparatus, further provided with an error correction encoder and a channel encoder of the invention.

Transmission via a transmission medium, such as a radio frequency link or a record carrier, generally requires an error correction encoding and a channel encoding carried out on the data compressed residual signal to be transmitted. FIG. 6 shows such signal processing steps carried out on the data compressed residual signal for the recording arrangement of FIG. 4. The recording arrangement of FIG. 6 therefore include an error correction encoder 56, well known in the art, and a channel encoder 58, also well known in the art.

It has been said above that, in some applications, it suffices to use a fixed conversion table to process the bitstream signal. Upon reconverting the residual bitstream signal into a replica of the original bitstream signal, also a fixed conversion table suffices. In an application where, for each subsequent portions of the bitstream signal, each time a corresponding conversion table needs to be determined each time in order to generate the residual bitstream signal, to use of the same conversion tables will be required for each of the portions in question upon reconverting the residual bitstream signal into the replica of the original bitstream signal. In such a situation, transmission of side information representative of the conversion tables used for the various subsequent portions may be required together with the residual signal so as to enable the reconversion upon reception.

As a further example, if it appears that it suffices to use only two conversion tables in the processing apparatus of FIG. 1, such side information could simply be a selection signal, selecting one of the two conversion tables. A corresponding reconversion apparatus could include the two conversion tables as well, and the selection signal could be used to select one of the two conversion tables, so as to reconvert the residual bitstream signal into the replica of the original bitstream signal.

It should however be noted that, when having derived a conversion table for a portion of the bitstream signal, it is not absolutely necessary to transmit side information corresponding to this conversion table to a reconverter apparatus. The reconverter apparatus may generate the conversion table by itself. The prediction unit in the reconversion apparatus will have a low prediction accuracy in the beginning, but will 'learn', so as to obtain a prediction conversion table, which will be substantially identical to the conversion table used in the transmitter apparatus.

Figure 7:
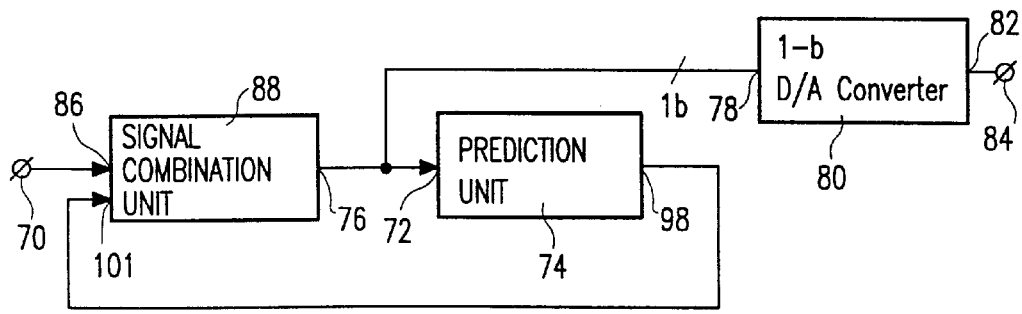
FIG. 7 shows an embodiment of another data processing apparatus of the invention for reconverting the residual bitstream signal into a replica of the original audio signal.

FIG. 7 shows a schematic embodiment of a second data processing apparatus in accordance with the invention, which is capable of reconverting the residual bitstream signal into the replica of the original bitstream signal. The apparatus has an input terminal 70 for receiving the residual bitstream signal, as supplied by the data processing apparatus of FIG. 1. The input terminal 70 is coupled to a first input 86 of a signal combination unit 88, which has an output 76 coupled to an input 72 of a prediction unit 74 as well as to an input 78 of a 1-bit DIA converter 80. An output 98 of the prediction unit 74 is coupled to a second input 101 of the signal combination unit 88. An output 82 of the D/A converter 80 is coupled to an output terminal 84.

The apparatus of FIG. 7, receives the residual bitstream via its input 70, which is supplied to the input 86 of the signal combination unit 88. The signal combination unit 88 combines the residue bitstream signal received via its input 86 with a predicted bitstream signal received via its input 101 so as to obtain a reconverted bitstream signal, and to supply the reconverted bitstream signal to its output 76. The prediction unit 74 carries out a prediction step on the reconverted bitstream signal, so as to obtain the predicted bitstream signal at its output 98. The DIA converter unit 80 carries out a D/A conversion on the reconverted bitstream signal, so as to obtain the replica of the original audio signal, which is supplied to the output terminal 84.

The data input to a prediction unit is known herein as a prediction signal. The bitstream signal provided at input 8 of prediction unit 10 in FIG. 1 is an example of such a prediction signal. The reconverted bitstream signal provided to input 72 of prediction unit 74 in FIG. 7 is another example of a prediction signal.

The prediction unit 74 can have any form, and could include a FIR filter or an IIR filter, where the coefficients of the filter are chosen (or derived) such that, the output signal of the prediction unit 74 is the predicted version of the bitstream signal.

Figure 8:
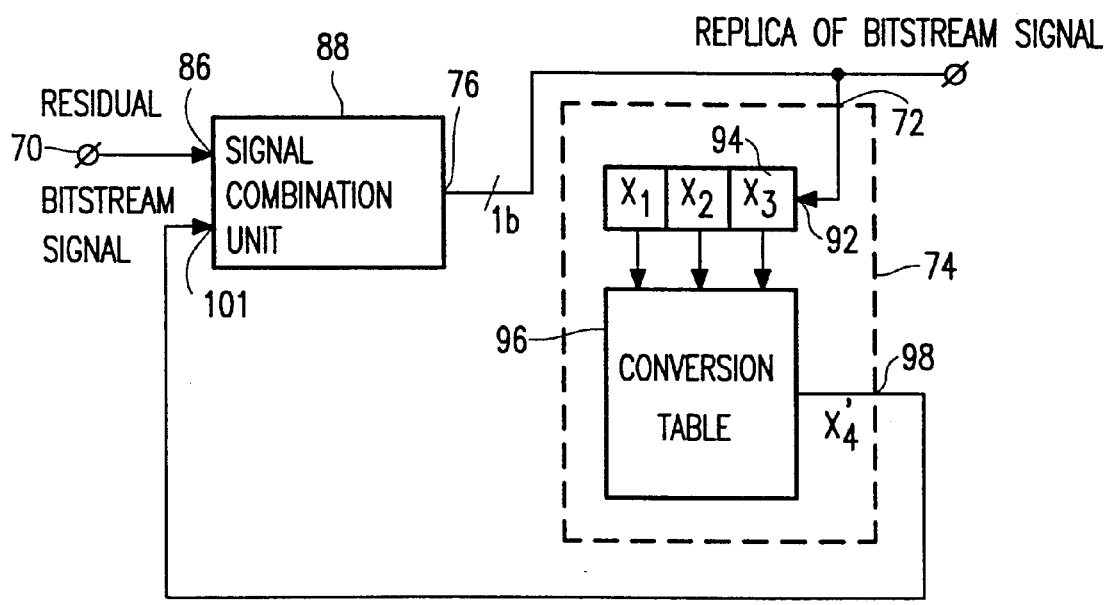
FIG. 8 shows an embodiment of the signal combination unit and the prediction unit incorporated in the apparatus of FIG. 7.

Another embodiment of the prediction unit 74 will be further explained with reference to FIG. 8. The input 72 of the prediction unit 74 is coupled to an input 92 of a three bit shift register 94. The three outputs of the three bit positions in the shift register 94 are coupled to corresponding inputs of a conversion unit 96. The conversion unit 96 includes the conversion table discussed and explained above with reference to the FIGS. 2 and 3. An output 98 of the conversion unit 96 is coupled to a second input 101 of the signal combination unit 88. The signal combination unit 88 can be in the form of an EXOR, but the combination unit 88 may be of a different construction, such as an EXNOR. It will be clear that, if the signal combination unit 42 of FIG. 3 is an EXOR, the signal combination unit 88 of FIG. 8 must be an EXOR as well, in order to regenerate a replica of the original bitstream signal.

In response to a 3-bit bit sequence $x_1, x_2, x_3$ stored in the shift register 94, the conversion unit 96 supplies the bit $x_4'$ at its output 98, as explained above with reference to the FIGS. 2 and 3. This bit $x_4'$ is a prediction of the bit $x_4$ that will be supplied upon the next clock pulse by the combination unit 88 and stored as the new bit $x_3$ in the most right storage position of the shift register 94. The residual bit present at the input 86 of the combination unit 88 is combined with the predicted bit $X_4'$ so as to obtain the replica of the original bit $x_4$ as in the original bitstream signal. When the residual bit is '0', which meant that a correct prediction was carried out in the apparatus of FIGS. 1 and 3, the combination of the residual bit with the predicted bit $x_4'$ results in the bitvalue of the bit $x_4'$ appearing at the output 76 of the combination unit 88. When the residual bit is '1', which meant that an incorrect prediction was carried out in the apparatus of FIGS. 1 and 3, the combination of the residual bit with the predicted bit $x_4'$ results in the inverse bitvalue of the bit $x_4'$ appearing at the output 76 of the combination unit 88. In both cases, a correct replica of the bit $x_4$ will appear at the output 76 of the combination unit 88.

Upon a subsequent clock signal (not shown), the bit $x_4$ present at the input 92 of the shift register 94, is shifted into the shift register 94, so that a new 3-bit bit sequence is stored in the shift register 94. The conversion unit 96 generates a new prediction bit $x_4'$ in response to this new 3-bit, bit sequence stored in the shift register 94. The signal combination unit 88 combines this new prediction bit $x_4'$ with the next residual bit in the residual bitstream signal applied to the input 86, so as to obtain a replica of the next bit $x_4$ in the bitstream signal. In this way, the replica of the bitstream signal is obtained.

Figure 9:
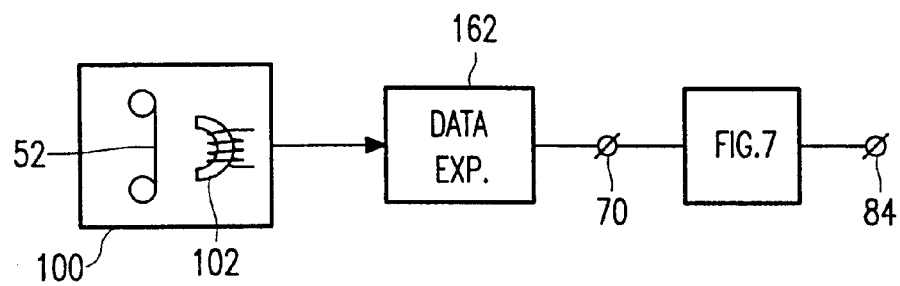
FIG. 9 shows the data processing apparatus of FIG. 7 incorporated in a reproducing apparatus for reproducing the residual bitstream signal from a record carrier.

FIG. 9 shows the data processing apparatus of FIG. 7 incorporated into a reproduction apparatus. The reproducing apparatus further includes a data expansion unit 162 for data expanding the data compressed residual bitstream signal so as to obtain a replica of the original residual bitstream signal and a read unit 100 for reading the data compressed residual bitstream signal from a track on the record carrier 52. In the present example, the record carrier 52 is a magnetic record carrier, so that the read unit 100 includes at least one magnetic head 102 for reading the data compressed residual bitstream signal from the record carrier 52. The record carrier may however be an optical record carrier, such as a CD disk (see FIG. 16) or a DVD disk.

Figure 10:
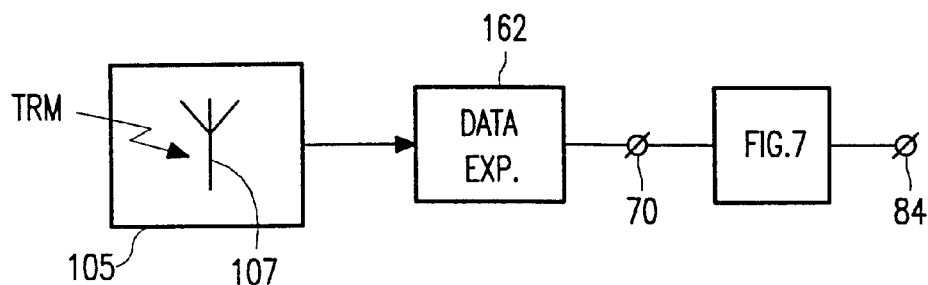
FIG. 10 shows the data processing apparatus of FIG. 7 incorporated in a receiving apparatus for receiving the residual bitstream signal from a transmission medium.

FIG. 10 shows an embodiment of a receiver for receiving an audio signal via a transmission medium TRM, including the data processing apparatus as shown in FIG. 7. The receiver further includes the data expansion unit 162 and a receiving unit 105 for receiving the data compressed residual bitstream signal from the transmission medium TRM. The receiving unit 105 could include an antenna 107.

Figure 11:
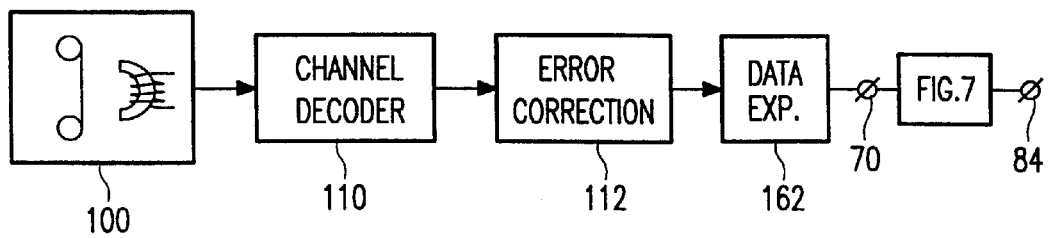
FIG. 11 shows a further embodiment of the reproducing apparatus, further provided with a channel decoder and an error correction unit of the invention.

As has been explained above, transmission via a transmission medium, such as a radio frequency link or a record carrier, generally requires an error correction encoding and a channel encoding carried out on the data compressed residual signal to be transmitted, so that a corresponding channel decoding and error correction can be carried out upon reception. FIG. 11 shows the signal processing steps of channel decoding and error correction carried out on the signal received by the reading means 100 for the reproducing arrangement of FIG. 9. The reproducing arrangement of FIG. 11 therefore includes a channel decoder 110, well known in the art, and an error correction unit 112, also well known in the art, so as to obtain a replica of the data compressed residual bitstream signal.

It has also been said above that, in some applications, it suffices to use a fixed conversion table to process the bitstream signal in the apparatus of the FIGS. 1 and 3. Upon reconverting the residual bitstream signal into a replica of the original bitstream signal, also a fixed conversion table suffices, so that no side information needs to be transmitted to the processing apparatus of the FIGS. 7 and 8. On the other hand in an application where, for each subsequent portions of the bitstream signal, a corresponding conversion table needs to be determined each time in the apparatus of the FIGS. 1 and 3 in order to generate the residual bitstream signal, use of the same conversion tables will be required for each of the portions upon reconverting the residual bitstream signal into the replica of the original bitstream signal in the apparatus of the FIGS. 7 and 8. In such a situation, transmission of side information representative of the conversion tables used for the various subsequent portions together with the residual signal will be required so as to enable the reconversion upon reception. As an example, this side information thus needs to be recorded on the record carrier 52, such as in the application where the apparatus of the FIGS. 1 and 3 is accommodated in a recording apparatus and the apparatus of the FIGS. 7 and 8 is incorporated in a reproducing apparatus of said FIG. 9 or 11, and be reproduced from said record carrier upon reproduction.

If it appears for example, that the use only two conversion tables is sufficient in the processing apparatus of FIG. 1, such side information could simply be a selection signal, selecting one of the two conversion tables. A corresponding reconversion apparatus could include the two conversion tables as well, and the selection signal could be used to select one of the two conversion tables so as to reconvert the residual bitstream signal into the replica of the original bitstream signal.

The embodiments described above are based on the prediction of 1 bit ($x_4'$) following a sequence of three subsequent bits ($x_1, x_2, x_3$) in the bitstream signal. In general, the prediction unit can be capable of predicting from n subsequent bits in the bitstream signal m prediction bits, the m prediction bits being predicted versions of m subsequent bits in the bitstream signal following the n subsequent bits in the bitstream signal, where n and m are integers larger than zero.

Figure 12:
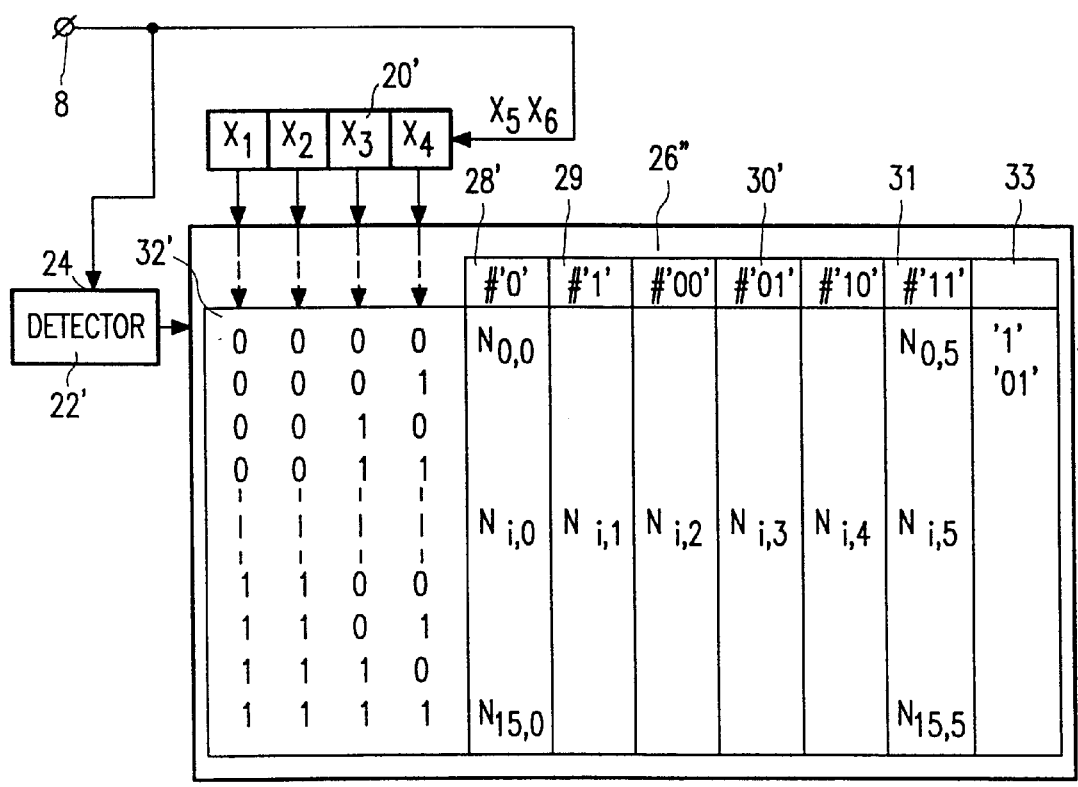
FIG. 12 shows the derivation of a conversion table for another embodiment of the prediction unit in the apparatus of FIG. 1 of the invention.

FIG. 12 shows an example of how to derive a conversion table capable of predicting one or two prediction bits from a sequence of four consecutive bits $x_1, x_2, x_3, x_4$ in the bitstream signal. FIG. 12 shows a part of another prediction unit 10' of FIG. 1, which includes a four bit shift register 20' having an input coupled to the input 8 of the prediction unit 10'. Upon the application of four clock pulses (not shown) to the shift register 20', four subsequent bits $x_1, x_2, x_3, x_4$ of the bitstream signal applied to the input 8 are shifted into the shift register 20'. A detector 22' is present having an input 24 coupled to the input 8 of the prediction unit 10'. The detector 22' detects the bit value of the next two bits $x_5, x_6$ directly following the four subsequent bits $x_1, x_2, x_3, x_4$ in the bitstream signal. Further, a counter 26" is present which counts the number of times that a '0' bit follows a specific four bit, bit sequence $x_1, x_2, x_3, x_4$, the number of times that a '1' bit follows that same specific four bit, bit sequence, the number of times that a two bit, bit sequence '00' follows that same specific four bit, bit sequence $x_1, x_2, x_3, x_4$, the number of times that a two bit, bit sequence '01' follows that same specific four bit, bit sequence, the number of times that a two bit, bit sequence '10' follows that same specific four bit bit sequence $x_1, x_2, x_3, x_4$ and the number of times that a two bit, bit sequence '11' follows that same specific four bit, bit sequence. It should be noted here, that the 2-bit, bit combination '$b_1, b_2$' will be expressed such that the first bit $b_1$ is the bit $x_5$, where the second bit $b_2$ is the bit $x_6$.

Suppose that the detector 22' has detected that the two bits $x_5, x_6$ equal '01'. As a result, the counter 26" increases the count value $N_{i,0}$ in the column 28' by one and the count value $N_{i,3}$ in the column 30' by one, where i runs from 0 to 15 and corresponds to the i-th four bit, bit sequence given in the column 32' of the table in FIG. 12.

Next, upon the application of a number of P clock pulses to the apparatus of FIG. 12, where P need not necessarily be equal to 2, but may be larger, another 4-bit, bit sequence $x_1, x_2, x_3, x_4$ of the bitstream signal is stored in the shift register 20'. The detector 22' detects the bit values of the next two bits $x_5, x_6$ in the bitstream signal following the 4-bit, bit sequence. Suppose, the next two bits equal '11'. As a result, the counter 26" increases the count value $N_{i,1}$ in the column 29 by one, and the count value $N_{i,5}$ in the column 31 by one, where i corresponds to the four bit, bit sequence stored in the shift register 20', which is assumed to be the i-th four bit, bit sequence given in the column 32' of the table in FIG. 12.

This procedure is repeated a plurality of times, so that for all the sixteen possible 4-bit, bit sequences $x_1, x_2, x_3, x_4$ the count values $N_{i,0}$ to $N_{i,5}$ have been obtained. The count values $N_{i,0}$ to $N_{i,5}$ indicate the number of occurrences of the one bit and two bit, bit sequences following the i-th 4-bit sequence given in column 32'.

Next, either a predicted binary value $x_5'$ or a predicted 2 bit binary sequence $x_5'x_6'$ is derived, based upon the count values in the columns 28', 29, . . . to 31, for each of the 4-bit sequences $x_1, x_2, x_3, x_4$ in the column 32.

Suppose that the count value $N_{i,0}$ or the count value $N_{i,1}$ of the six count values $N_{i,0}$ to $N_{i,5}$ for the i-th 4 bit, bit sequence in column 32' is substantially larger than all the others. In such a situation, one can decide to choose the '0' bit or '1' bit, respectively, as the prediction bit $x_5'$. Suppose that $N_{i,0}$ and $N_{i,2}$ do not differ very much and are larger than the other four count values. In such a situation, one could decide to choose the bit combination '00' as the prediction bits $x_5', x_6'$ for the i-th bit sequence.

In this way, the conversion table obtained can thus include a column 33 which may include either a one bit value as a prediction bit for predicting the bit following a specific 4-bit bit sequence in the bitstream signal, or a 2-bit binary word as a 2-bit prediction word for predicting the 2-bit word following another specific 4-bit bit sequence in the bitstream signal.

Figure 13:
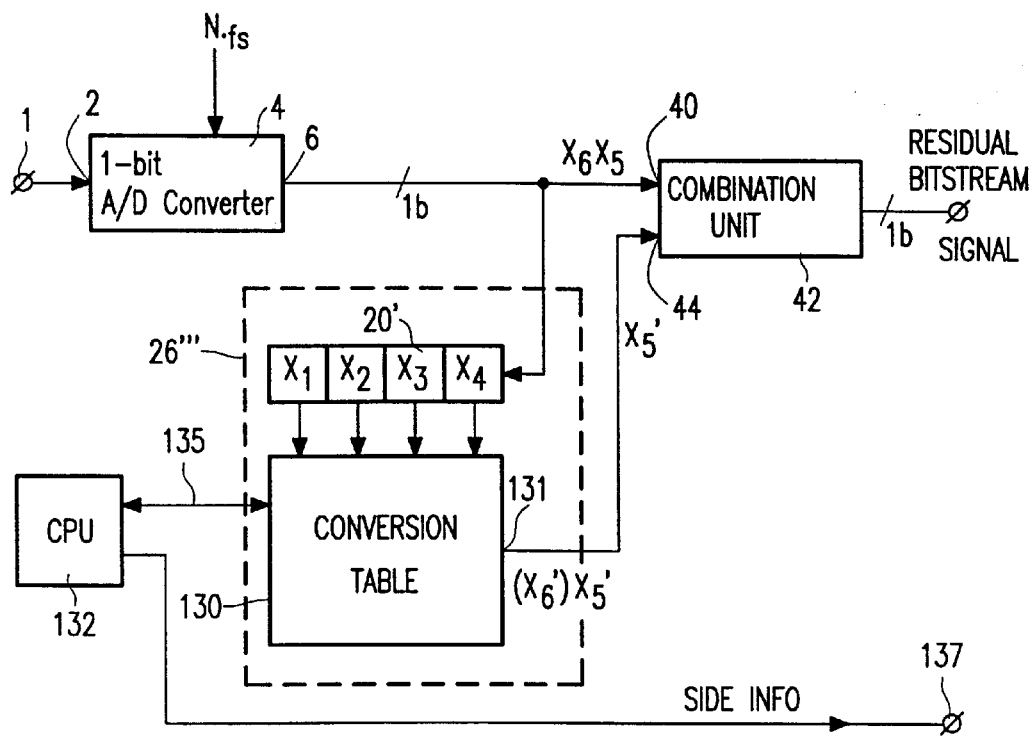
FIG. 13 shows another embodiment of the data processing apparatus.

FIG. 13 shows schematically another embodiment of the data processing apparatus for data processing an audio signal, which comprises a conversion unit 130 in the form of a conversion table, such as the one explained with reference to FIG. 12. That means that the conversion table includes the columns 32' and 33 given in FIG. 12, so that upon the receipt of a specific 4-bit bit sequence $x_1, x_2, x_3, x_4$, as given in column 32', a specific prediction bit $x_5$ or two specific prediction bits $x_5, x_6$ will be generated at the output 131 of the conversion unit 130.

The functioning of the apparatus of FIG. 13 is as follows. In response to a specific 4-bit, bit sequence stored in the shift register 20' the conversion unit 130 generates as an example, a one bit word, equal to '1'. This is the case when a 4-bit sequence '0000' is stored in the shift register 20'. The column 33 shows that upon such 4-bit sequence, see column 32' in the table of FIG. 12, a '1' bit is predicted, see the column 33 in the table of FIG. 12. The predicted bit $x_5'$ is supplied to the input 44 of the combination unit 42 in which the predicted bit $x_5'$ is combined with the real bit $x_5$ in the bitstream, present at the input 40. Next, upon one clock pulse, generated by a central processing unit 132, the information in the shift register 20' is shifted one position to the left, so that the bit $x_5$ is now stored in the most right storage location of the shift register 20'. Suppose, this bit was indeed a '1' bit, as predicted.

Next, the conversion unit converts the 4-bit sequence '0001' stored in the shift register 20' into a 2-bit word '01', see the columns 32' and 33 in the table of FIG. 12. The 2-bit word is supplied to the output 131. The central processing unit 132 now generates two clock pulses so that the 2-bit prediction word '01' can be combined in the combination unit 42 with the actual bits $x_5, x_6$ in the bitstream signal. The two clock pulses also result in a shift by two positions to the left in the shift register 20' so that the shift register has the values '0' and '1' stored in the positions in the shift register 20', indicated by $x_1$ and $x_2$, and the actual bits $x_5$ and $x_6$ mentioned above are now stored as the new bits $x_3$ and $x_4$ in the shift register 20'. Thus, upon predicting one bit, the central processing unit 132 generates one clock pulse, after which a subsequent prediction step is carried out, whereas, upon predicting a 2-bit word, the central processing unit 132 generates two clock pulses before a subsequent prediction step is carried out.

Figure 14:
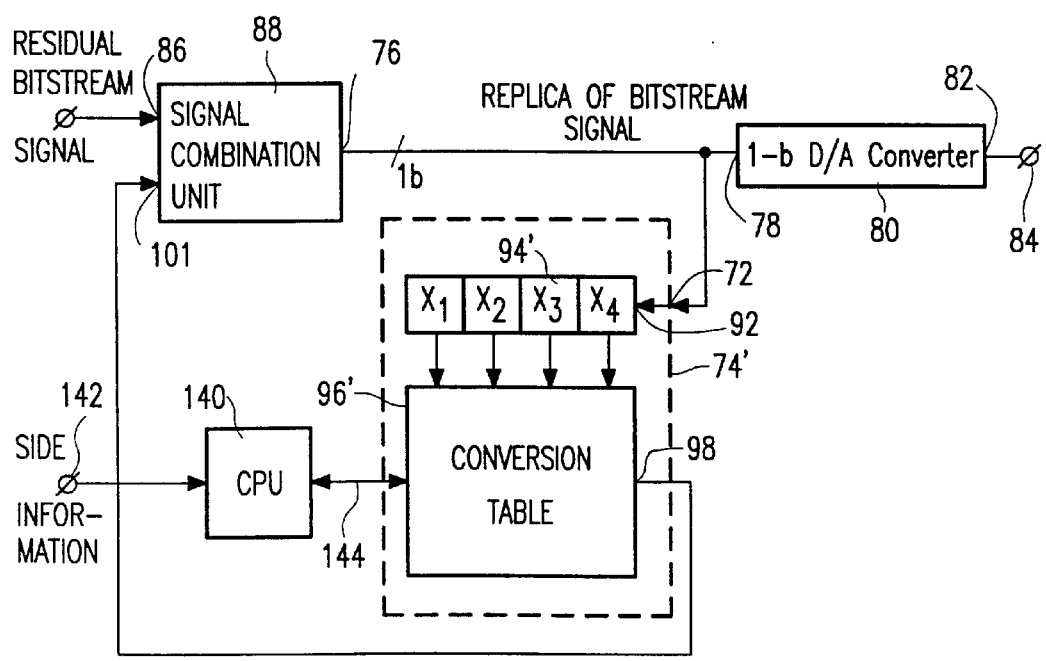
FIG. 14 shows an embodiment of a data processing apparatus for reconverting the residual bitstream signal obtained by the apparatus of FIG. 14 into a replica of the original audio signal.

Suppose that, for subsequent portions of the bitstream signal, a corresponding conversion table is derived first, eg. as explained above with reference to FIG. 12. Then it is desired to transmit the conversion table together with the residual bitstream signal so as to enable reconversion upon reception of the residual bitstream signal. FIG. 13 shows a connection 135 between the prediction unit 26'" and the central processing unit 132. Via this connection, the conversion table derived as described with reference to FIG. 12, can be supplied to the central processing unit 132 and subsequently supplied to an output 137 for transmission together with the residual bitstream signal via the transmission medium. FIG. 14 shows a corresponding apparatus for reconverting the residual bitstream signal supplied by the apparatus of FIG. 13. The apparatus of FIG. 14 shows a large resemblance with the apparatus of the FIGS. 7 and 8, in the sense that, the signal combination unit 88 and the D/A converter 80 are the same as the signal combination unit and the D/A converter respectively of FIG. 7. The input 72 of the prediction unit 74' is coupled to an input 92 of a four bit shift register 94'. The four outputs of the four bit positions in the shift register 94' are coupled to corresponding inputs of a conversion unit 96'. The conversion unit 96' includes the conversion table discussed and explained above with reference to the FIG. 12. An output 98 of the conversion unit 96' is coupled to a second input 101 of the signal combination unit 88.

In response to a 4-bit, bit sequence $x_1, x_2, x_3, x_4$ stored in the shift register 94', the conversion unit 96' supplies either a 1-bit $X_5'$ at its output 98 or a 2-bit word $x_5', x_6'$, as explained above with reference to FIG. 12. This bit $x_5'$ is a prediction of the bit $x_5$, given by the conversion table 96', that will be supplied upon the next clock pulse by the combination unit 88 and stored as the new bit $x_4$ in the most right storage position of the shift register 94'. The residual bit present at the input 86 of the combination unit 88, is combined with the predicted bit $x_5'$ upon the clock pulse generated by the central processing unit 140, so as to obtain the replica of the original bit $x_5$ in the original bitstream signal. When the residual bit is '0', which means that a correct prediction was carried out in the apparatus of FIG. 13, the combination of the residual bit with the predicted bit $x_5'$ results in the bit $x_5'$ appearing at the output 76 of the combination unit 88 as the bit $x_5$. When the residual bit is '1', which means that an incorrect prediction was carried out in the apparatus of FIG. 13, the combination of the residual bit with the predicted bit $x_5'$ results in the inverse of the bit $x_5'$ appearing at the output 76 of the combination unit 88 as the bit $x_5$. In both cases, a correct replica of the bit $x_5$ will appear at the output 76 of the combination unit 88.

The 2-bit prediction $x_5', x_6'$ is a prediction of the 2-bit word $x_5, x_6$, generated by the conversion table 96', that will be supplied upon the next two clock pulses of the central processing unit 140 by the combination unit 88. This z-bit prediction will be stored as the new 2-bit word $X_3, X_4$ in the two most right storage positions of the shift register 94'. Two residual bits present at the input 86 of the combination unit 88 are combined with the predicted 2-bit word $x_5', x_6'$ so as to obtain the replica of the original 2-bit word $x_5, x_6$ in the original bitstream signal. When the two residual bits are '0,0', which means that a correct prediction was carried out in the apparatus of FIG. 13, the combination of the residual bits with the predicted bits $x_5', x_6'$ results in the of the two bits $x_5', x_6'$ appearing at the output 76 of the combination unit 88 as the bits $x_5, x_6$. When the residual bits were '1,1', which means that an incorrect prediction was carried out in the apparatus of FIG. 13 on both the bits $x_5$ and $x_6$, the combination of the two residual bits with the predicted bits $x_5',x_6'$ results in the inverse bitvalues of the bits $x_5',x_6'$ appearing at the output 76 of the combination unit 88 as the bits $x_5,x_6$. When one of the two residual bits is '1' and the other is '0', this means that one of the prediction bits is wrong and should be inverted in order to obtain two correct bits $x_5,x_6$. In all cases, a correct replica of the 2-bit word $x_5,x_6$ will appear at the output 76 of the combination unit 88.

In the situation where, for subsequent portions of the bitstream signal, a corresponding conversion table is derived first in the apparatus of FIG. 13, eg. as explained above with reference to FIG. 12, it is desired to transmit the conversion table together with the residual bitstream signal, so as to enable reconversion upon reception of the residual bitstream signal in the apparatus of FIG. 14. FIG. 14 therefore shows an input terminal 142 for receiving the conversion table. The input terminal 142 is coupled to the central processing unit 140, which has a connection 144 with the prediction unit 96'. Via this connection, the conversion table can be supplied to the prediction unit 96'.

It has been said earlier that, a data compression step is carried out on the residual bitstream signal prior to transmission. Preferably, a data compression using a lossless coder is carried out. Lossless coders have the advantage that they can data compress the audio signal in such a way that, after data expansion by a lossless decoder, the original audio signal can be reconstructed in a substantially lossless way. That means that there is substantially no loss of information after compression-expansion. Lossless coders can be in the form of a variable length coder. Variable length coders are well known in the art. Examples of such variable length coders are Huffman coders, arithmetic coders and Lempel-Ziv coders. Reference is made in this respect to the publications "A method for the construction of minimum-redundancy codes" by D. A. Huffman, document D4 above, "An introduction to arithmetic coding" by G. G. Langdon, document D5 above, and "A universal algorithm for sequential data compression" by J. Ziv et al, document D6 above.

Figure 15:
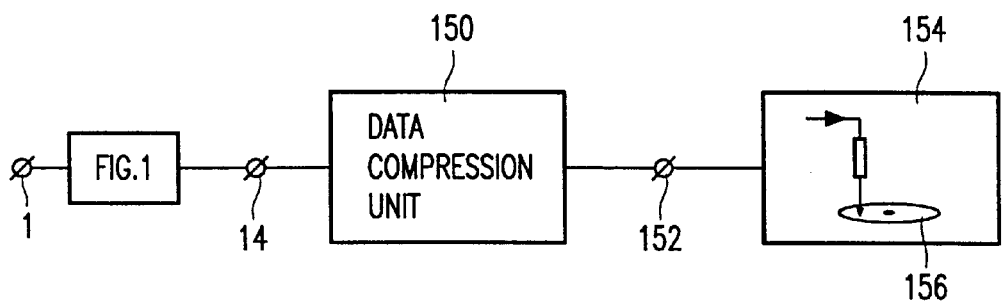
FIG. 15 shows the application of a data compression unit of the invention, in a recording apparatus.

FIG. 15 shows an embodiment in which the apparatus of FIG. 1 is followed by a data compression unit 150, such as a lossless coder. The data compressed residual bitstream signal is recorded on an optical record carrier 156 by means of an optical recording unit 154.

Figure 16:
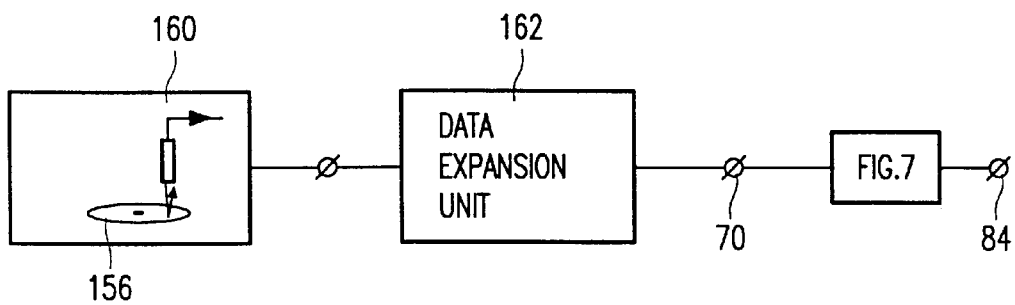
FIG. 16 shows the application of a data expansion unit of the invention, in a reproduction apparatus.

FIG. 16 shows the corresponding reproduction from the optical record carrier 156. The apparatus shown in FIG. 16 includes a data expansion unit 162, such as a lossless decoder, that carries out a data expansion step on the data compressed residual bitstream signal. The regenerated residual bitstream signal is supplied to the input 70 of the apparatus of FIG. 7.

Figure 18:
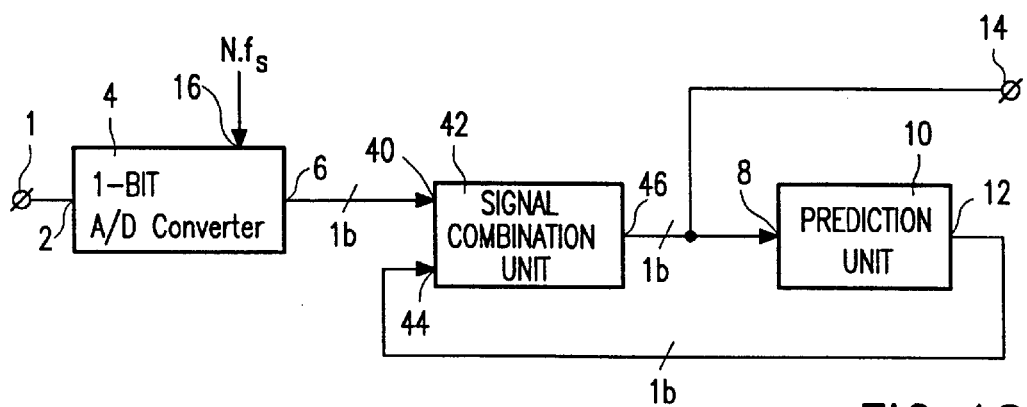
FIG. 18 shows a modification of the apparatus of FIG. 1.

A further modification of the embodiment of FIG. 1 and shown in FIG. 18 is as follows. In this modification, the prediction unit 10 is coupled between the output of the signal combination unit 42 and the input 44 of the signal combination unit 42. In this modification, the predicted version of the bitstream signal is derived by the prediction unit from the residual signal, supplied by the signal combination unit 42. This modification is shown in FIG. 18, which is in fact identical to the circuit construction of the prediction unit and the signal combination unit shown in FIG. 7.

In an equivalent way, a further modification of the embodiment of FIG. 7 is as follows. In this modification, the prediction unit 74 is coupled between the input terminal 70 and the input 101 of the signal combination unit 88. In this modification, the predicted version of the bitstream signal is derived by the prediction unit from the residual signal, supplied to the processing apparatus via the terminal 70. This modification is in fact identical to the circuit construction of the prediction unit and the signal combination unit shown in FIG. 1.

A further improvement of the data processing apparatus can be obtained by a specific embodiment of the prediction unit, such as the prediction unit 10 in FIG. 1. In this specific embodiment, the prediction unit 10 is provided with an integrator for integrating the input signal, which is a representation of the bitstream signal, in the sense that the input signal has −1 and +1 representation values to represent the '0' and '1' bits in the bitstream signal. The integrator simply sums all the representation values, so its instantaneous output is the cumulative sum of all −1 and +1 values it has received. What the prediction unit in fact does, is to generate a pseudo audio signal and the predicted bit for the bitstream signal to be supplied to the output 12 is derived from this pseudo audio signal in the following way.

The predictor also includes extrapolator 183 which derives from the last n sample values of the pseudo audio signal generated by the integrator a prediction value for the next sample of the pseudo audio signal. Next in a derivator 184 of the predictor unit the value of the last sample of the pseudo audio signal generated, is compared with the predicted value of the next sample. If, viewed along an amplitude axis, the value of the last sample of the pseudo audio signal is smaller than the prediction value of the next sample, it is concluded that the next predicted bit in the predicted bitstream signal corresponds to the +1 value (or logical '1') and when the value of the last sample of the pseudo audio signal is larger than the prediction value of the next sample, it is concluded that the next predicted bit in the bitstream signal corresponds to the −1 value (or logical '0'). The predicted bits are supplied to the output of the prediction unit 10 as the predicted bitstream signal.

The predicted value of the next sample can be obtained by approximating the last n (which eg. equals 40) samples of the pseudo audio signal with a straight line. It will be understood that more sophisticated approximation procedures (filter techniques) are equally possible to predict the next sample value. In such situation, as said earlier, filter coefficients for such filters should be derived for the signal on a frame basis and transmitted so as to enable a corresponding decoding on the receiver side.

Figure 19:
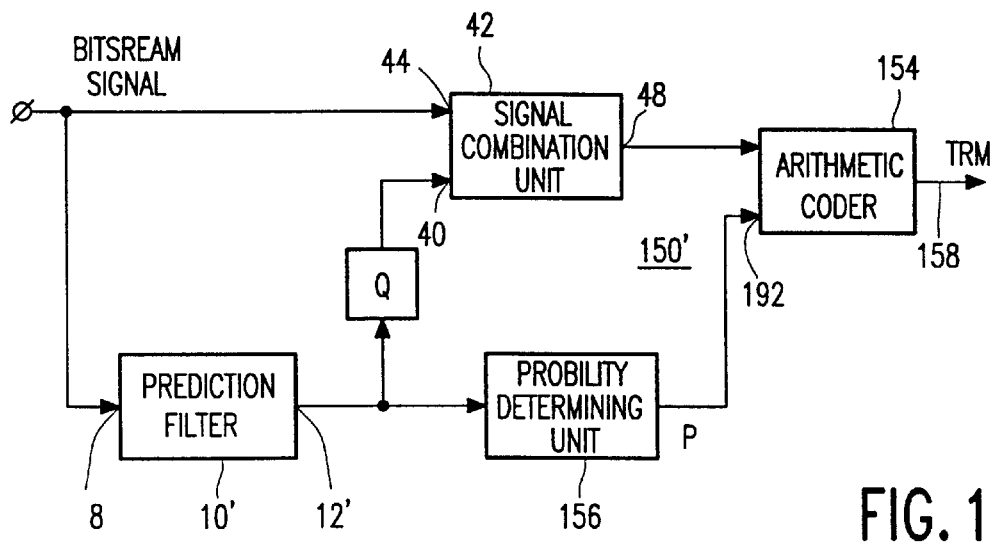
FIG. 19 a data processing apparatus of the invention, provided with an arithmetic coder.

Another data processing apparatus is shown in FIG. 19. In the data processing apparatus of FIG. 19, the bitstream signal is supplied to the input 44 of the signal combination unit 42, and via a prediction filter 10' and a quantizer Q to the input 40 of the signal combination unit 42. The apparatus is further provided with a data compression unit 150' which includes an entropy encoder 154 and a probability determining unit 156. In the present example, the entropy encoder 154 is in the form of an arithmetic coder for encoding the residual bitstream signal into a data compressed residual bitstream signal in response to probability values p supplied to its input 192. The probability determining unit 156 determines a probability value indicating the probability that a bit in the residual bitstream signal supplied by the combination unit 42 has a predetermined logical value, such as '1'. This probability value, denoted p in FIG. 19, is supplied to the arithmetic coder 154, so as to enable the data compression of the residual bitstream signal in the arithmetic coder 154. The determining unit 156 determines this probability value from the output signal of the prediction filter 10'. This is different from what one would expect when using an arithmetic coder in the data compression unit 150, such as in FIG. 4 or 15, for compressing the residual bitstream signal. When using an arithmetic coder in the compression unit 150, the probability unit 156 would derive the probability value from the residual bitstream signal itself. In the embodiment of FIG. 19, however, the probability determining unit 156 derives the probability value from the output signal generated by the prediction filter 10'. This has an advantage, in that a higher compression ratio can be obtained with the arithmetic coder 154. The arithmetic coder 154 can data compress the residual bitstream signal on a frame basis.

The functioning of the apparatus of FIG. 19 is as follows. The prediction filter 10' provides a prediction filtering on the bitstream signal so as to obtain a multi bit output signal. The multi bit output signal has a plurality of levels within a range of eg. +3 and −3. A quantizer Q receives the multi bit output signal and generates a bitstream signal therefrom, eg. by allocating a bit of '1' logical value if the multi bit output signal has a positive value, and allocating a bit of '0' logical value if the multi bit output signal has a negative value. Furthermore, for each of a plurality of subintervals in the value range of the multi bit output signal, it is determined what the probability is that the corresponding bit in the residual signal is eg. a '1' bit. This can be implemented by counting the number of 'ones' and 'zeroes' occurring in the residual bitstream signal during a specific time interval, when the multi bit output signal falls in one of such ranges. The probabilities thus obtained for the various values in the multi bit output signal is subsequently supplied as the probability signal p to the arithmetic coder 154. The data compressed residual bitstream signal is supplied by the arithmetic coder 154 to an output line 158, for transmission via a transmission medium TRM.

Figure 20:
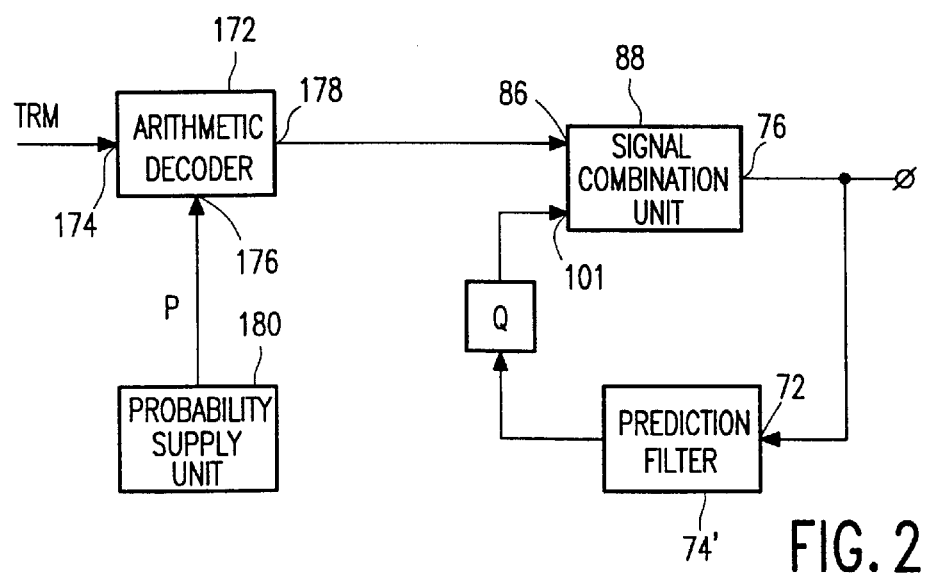
FIG. 20 depicts a data processing apparatus of the invention, provided with an arithmetic decoder.
Figure 21:
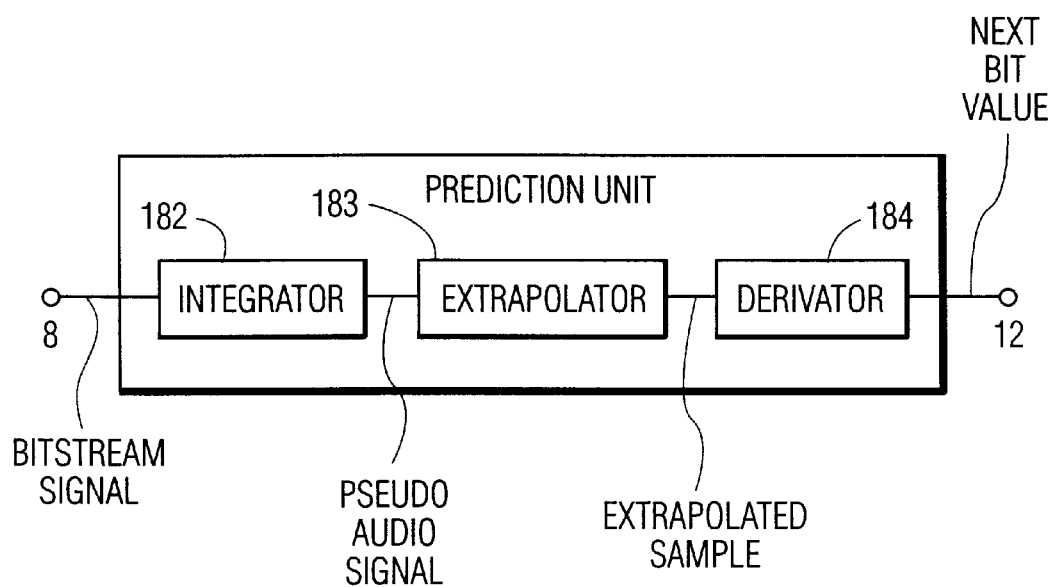
FIG. 21 illustrates the prediction unit of FIG. 1 including an integrator.

FIG. 20 shows a corresponding data processing apparatus for decoding the data compressed residual bitstream signal, received via the transmission medium TRM. The data processing apparatus of FIG. 20 includes an entropy decoder 172, which receives the data compressed residual bitstream signal via an input 174. In the present example, the entropy decoder 172 is in the form of an arithmetic decoder that carries out an arithmetic decoding step on the data compressed bitstream signal under the influence of a probability signal p, supplied to an input 176 so as to generate a replica of original residual bitstream signal which is supplied to an output 178. The replica signal is supplied to an input 86 of the signal combination unit 88. The signal combination unit 88 further receives a predicted version of the bitstream signal via the input 101 and generates the replica of the original bitstream signal at its output 76. The output 76 is coupled via a prediction filter 74' and a quantizer Q to the input 101 of the signal combination unit 88. The functioning of the prediction filter 74' and the quantizer Q can be identical to the functioning of the prediction filter 10' and the quantizer Q in FIG. 19, that is: the prediction filter 74' derives its filter coefficients from the input signal it receives via its input 72. In another embodiment, the prediction filter 74' receives the filter coefficients from side information received via the transmission medium TRM from the encoder apparatus of FIG. 19, as will be explained below.

Further, a probability supply unit 180 is present for supplying the probability signal p to the arithmetic decoder 172. The probability signal p can be obtained in different ways. One way is, to derive the probability signal p from the output signal of the prediction filter 74', in the same way as the probability determining unit 156 determines probability signal p from the prediction filter 10' in FIG. 19. In such a situation, the supply unit 180 in FIG. 20 can be identical to the determining unit 156 in FIG. 19, and the supply unit 180 has an input coupled to the output of the prediction filter 74'. Another way of generating the probability signal p, is by using side information received via the transmission medium TRM, as will be explained hereafter.

Side information can be generated by the apparatus of FIG. 19 for transmission to the apparatus of FIG. 20. Such side information can include the filter coefficients for the filter 10' that are determined on a frame by frame basis, which coefficients are transmitted to the filter 74' for setting the correct filter characteristic of the filter 74'. Further, the apparatus of FIG. 19 can generate parameters that describe the conversion of the multi bit output signal of the prediction filter 10' into the probability signal p. Such parameters are also included in the side information and transmitted to the supply unit 180, so as to enable the regeneration of the probability signal p in the apparatus of FIG. 20.

In the above described embodiments of the FIGS. 19 and 20, it is explained how the probability signal p can be derived from the multi bit output signal from the prediction filter 10' and 74' respectively. It should however be noted that the application of an arithmetic coder is also possible in data processing apparatuses that derive the predicted signal in a different way. Reference is made in this respect to the embodiments shown in FIG. 1, where the prediction unit 10 is in the form as disclosed in the FIGS. 2 or 12. Now another way of deriving the probability signal p is required. It will be clear that, in the embodiments of the prediction unit as shown in FIGS. 2 and 12, the probability signal p can be derived from the count numbers derived in the detector 22 and 22' respectively.

The entropy encoder used in the embodiment of FIG. 19 is adapted to encode the residual bitstream signal using a probability signal in order to obtain the data compressed residual bitstream signal. One such entropy encoder is the arithmetic encoder described above. Another type of such entropy coder is, as an example, the well known finite state encoder. The entropy decoder used in the embodiment of FIG. 20 is adapted to decode the data compressed residual bitstream signal using a probability signal in order to obtain a replica of the residual bitstream signal. One of such entropy decoder is the arithmetic decoder described above. Another type of such entropy decoder is, as an example, the well known finite state decoder.

Whilst the invention has been described with reference to preferred embodiments thereof, it is to be understood that these are not limitative examples. Thus, various modifications may become apparent to those skilled in the art, without departing from the scope of the invention, as defined by the claims. When the audio signal is supplied in digital form, such as sampled at 44.1 kHz and the samples being expressed in eg. 16 bits, the A/D converter means are adapted to oversample the digital audio signal with eg. the frequency of 64×44.1 kHz so as to obtain the 1-bit bitstream signal which is supplied to the prediction unit 10.

Further, as regards the conversion tables, such as the one shown and described in FIG. 12, the following can be said. In the phase of deriving the conversion table, it may occur that, as an example, the count values are such that the bit sequences 0,0,0,0 and 0,0,1,0 result in the same prediction bit(s), that the bit sequences 0,0,0,1 and 0,0,1,1 result in the same prediction bit(s), that the bit sequences 0,1,0,0 and 0,1,1,0 result in the same prediction bit(s), that the bit sequences 1,0,0,0 and 1,0,1,0 result in the same prediction bit(s), the bit sequences 1,1,0,0 and 1,1,1,0 result in the same prediction bit(s), that the bit sequences 1,0,0,1 and 1,0,1,1 result in the same prediction bit(s), that the bit sequences 1,1,0,1 and 1,1,1,1 result in the same prediction bit(s), and that the bit sequences 0,1,0,1 and 0,1,1,1 result in the same prediction bit(s). In this situation, the bit $x_3$ is in fact a don't care bit and the prediction bit(s) $X_4$ or $x_4,x_5$ can be predicted from the bit combination $x_1,x_2,x_4$ alone.

Further, the invention lies in each and every novel feature or combination of features.

What is claimed is:

1. Data processing apparatus comprising:
   means for providing an audio signal;
   means for converting the audio signal into a converted 1-bit bitstream signal;
   means for predicting depending on a prediction signal to obtain a predicted bitstream signal;
   means for combining the converted 1-bit bitstream signal and the predicted bitstream signal to obtain a residual bitstream signal; and
   means for outputting the residual bitstream signal as an output signal from the data processing apparatus; and
   wherein the prediction signal is the residual bitstream signal.

2. The apparatus of claim 1, wherein:
   the audio signal includes an analog audio signal; and
   the conversion means include A/D conversion means for 1-bit A/D conversion of the analog audio signal into the converted 1-bit bitstream signal.

3. The apparatus of claim 2, wherein the A/D conversion means include a sigma-delta modulator.

4. The apparatus of claim 1, wherein the predicting means include a predictor unit with means for predicting from n sequential bits in the prediction signal, m prediction bits which are predicted versions of m sequential bits in the converted 1-bit bitstream signal following the input of the n sequential bits in the prediction signal, where n and m are integers larger than zero.

5. The apparatus of claim 4, wherein the combination means combine the m prediction bits with the m sequential bits in the converted 1-bit bitstream signal to obtain m sequential bits of the residual bitstream signal.

6. The apparatus of claim 5, wherein the combination means include an EXOR gate.

7. The apparatus of claim 4, wherein the predicting means include a conversion table with means for supplying m prediction bits in response to a sequence of n bits in the prediction signal.

8. The apparatus of claim 7, where the conversion table includes means to supply $m_1$ prediction bits for a first sequence of n bits of the prediction signal and $m_2$ prediction bits for a second sequence of n bits in the prediction signal, where $m_1$ and $m_2$ are different integers.

9. The apparatus of claim 4, wherein the predicting means include:
   calculation means for determining for a portion of the converted 1-bit bitstream signal, the sequence of m bits following the input of a predetermined sequence of n sequential bits of the prediction signal, that has the highest probability of occurrence after the occurrence of the predetermined sequence of n bits in the prediction signal; and
   means for allocating the sequence of m bits as the m prediction bits to the predetermined sequence of n bits.

10. A data processing method comprising the steps of:
    providing an audio signal to a data processor;
    converting the audio signal into a converted 1-bit bitstream signal;
    predicting depending on a prediction signal to obtain a predicted bitstream signal;
    combining the converted 1-bit bitstream signal and the predicted bitstream signal to obtain a residual bitstream signal; and
    outputting the residual bitstream signal as an output signal from the data processor; and
    wherein the prediction signal is the residual bitstream signal.

11. A transmitter comprising:
    means for providing an audio signal;
    means for converting the audio signal into a converted 1-bit bitstream signal;
    means for predicting depending on a prediction signal to obtain a predicted bitstream signal;
    means for combining the converted 1-bit bitstream signal and the predicted bitstream signal to obtain a residual bitstream signal; and
    means for data compressing the residual bitstream signal into a data compressed residual bitstream signal; and
    means for outputting the data compressed residual bitstream signal as an output signal from the transmitter into a transmission medium; and
    wherein the prediction signal is the residual bitstream signal.

12. The transmitter of claim 11, wherein:
    the predicting means include a conversion table for supplying m prediction bits in response to a sequence of n bits from the prediction signal; and
    the outputting means apply side information representative of the conversion table to the transmission medium.

13. The transmitter of claim 11, further comprising additional processing means for processing data compressed residual bitstream signal prior to applying the residual bitstream signal to the transmission medium selected from one or more of:
    means for error correction encoding the data compressed residual bitstream signal; and
    means for channel encoding the data compressed residual bitstream signal.

14. The transmitter of claim 11 wherein:
    the transmission medium is a record carrier; and
    the outputting means write the residual bitstream signal in a track on the record carrier.

15. The transmitter of claim 14, wherein the record carrier is an optical or a magnetic record carrier.

16. A record carrier produced by the process of claim 10, comprising:
    a substrate; and
    the residual bitstream signal recorded in a track on the substrate of the record carrier.

17. An apparatus comprising:
    means for receiving a residual bitstream signal;
    means for combining the residual bitstream signal with a predicted bitstream signal to obtain a reconverted bitstream signal;
    means for predicting the predicted bitstream signal depending on a prediction signal;
    D/A means for D/A conversion of the reconverted bitstream signal into a replica of an original audio signal; and
    means for outputting the replica of the original audio signal as an output signal from the apparatus; and wherein the predicting means include a predictor unit with means for predicting from n sequential bits in the prediction signal, m prediction bits which are predicted versions of m sequential bits in the reconverted bitstream signal following the n sequential bits in the prediction signal, where n and m are integers larger than zero.

18. The apparatus of claim 17, wherein the signal combination means combine the m prediction bits with m bits in the residual bitstream signal to obtain the m sequential bits of the reconverted bitstream signal.

19. The apparatus of claim 18, wherein the signal combination means include an EXOR gate.

20. The apparatus of claim 17, wherein the predicting means include a conversion table with means for supplying m prediction bits in response to a sequence of n bits in the prediction signal.

21. The apparatus of claim 20, wherein the conversion table includes means to supply $m_1$ prediction bits for a first sequence of n bits of the prediction signal and $m_2$ prediction bits for a second sequence of n bits in the prediction signal, and in which $m_1$ and $m_2$ are different integers.

22. An apparatus comprising:
means for providing a 1-bit bitstream signal;
means for predicting depending on a prediction signal to obtain a predicted bitstream signal;
means for combining the provided 1-bit bitstream signal and the predicted bitstream signal so as to obtain a residual bitstream signal;
means for data compressing the residual bitstream signal and including an entropy encoder with means for entropy encoding the residual bitstream signal in response to a probability signal into a data compressed residual bitstream signal;
means for determining the probability signal depending on the predicting; and
means for outputting the data compressed residual bitstream signal as an output signal from the apparatus.

23. The apparatus of claim 22, wherein:
the predicting means include: means for predictive filtering the prediction signal supplied to its input to obtain a multi-value output signal; and means for quantizing the multi-value output signal to obtain the predicted bitstream signal; and
the determining means derive the probability signal from the multi-value output signal.

24. A method comprising the steps of:
providing a 1-bit bitstream signal to a data processor;
predicting depending on a prediction signal to obtain a predicted bitstream signal;
combining the provided 1-bit bitstream signal and the predicted bitstream signal to obtain a residual bitstream signal;
determining a probability signal depending on the predicting;
data compressing the residual bitstream signal by entropy encoding the residual bitstream signal in response to the probability signal to obtain a data compressed residual bitstream signal; and
outputting the data compressed residual bitstream signal as an output signal from the data processor.

25. The method of claim 24, wherein:
the predicting step includes the substeps of:
predictive filtering the prediction signal to obtain a multi-value output signal; and quantizing the multi-value output signal to obtain the predicted bitstream signal; and
the probability determining substep includes deriving the probability signal from the multi-value output signal.

26. An apparatus comprising:
means for providing a 1-bit bitstream signal;
means for predicting depending on a prediction signal to obtain a predicted bitstream signal;
means for combining the provided 1-bit bitstream signal and the predicted bitstream signal to obtain a residual bitstream signal;
means for outputting the residual bitstream signal as an output signal from the apparatus; and
wherein the predicting means include:
integrator means for integrating the prediction signal supplied to its input to obtain a pseudo audio signal;
extrapolation means for deriving an extrapolated sample from the last n samples of the pseudo audio signal generated by the integrator means, where n is an integer value larger than 1; and
means for deriving a next bit value of the predicted bitstream signal from the extrapolated sample and the last sample of the pseudo audio signal generated by the integrator means.

27. A method comprising the steps of:
receiving a 1-bit bitstream signal into a data processor;
predicting depending on a prediction signal to obtain a predicted bitstream signal;
combining the received 1-bit bitstream signal and the predicted bitstream signal to obtain a residual bitstream signal; and
outputting the residual bitstream signal as an output signal from the data processor;
and wherein the predicting step includes the substeps of:
integrating the prediction signal to obtain a pseudo audio signal;
deriving an extrapolated sample from the last n samples of the pseudo audio signal generated in the integration substep where n is an integer value larger than 1; and
deriving a next bit value of the predicted bitstream signal from the extrapolated sample and the last sample of the pseudo audio signal generated in the integration substep.

28. An apparatus comprising:
means for receiving a data compressed residual bitstream signal into the apparatus;
means including an entropy decoder, for entropy decoding the data compressed residual bitstream signal in response to a probability signal to obtain a replica of the residual bitstream signal;
means for providing the probability signal;
means for combining the residual bitstream signal with a predicted bitstream signal to obtain a reconverted bitstream signal;
means for predicting depending on a prediction signal to obtain the predicted bitstream signal; and
means for outputting the reconverted bitstream signal as an output signal from the apparatus.

29. A method comprising the steps of:
receiving a data compressed residual bitstream signal into a data processor;
providing a probability signal;
data expanding the data compressed residual bitstream signal into a replica of the residual bitstream signal and including entropy decoding the data compressed residual bitstream signal in response to the probability signal;

combining the residual bitstream signal with a predicted bitstream signal to obtain a reconverted bitstream signal;

predicting depending on a prediction signal to obtain the predicted bitstream signal; and outputting the reconverted bitstream signal as an output signal from the data processor.

30. An apparatus comprising:

means for receiving a residual bitstream signal into the apparatus;

means for combining the residual bitstream signal with a predicted bitstream signal to obtain a reconverted bitstream signal;

means for predicting depending on a prediction signal to obtain the predicted bitstream signal;

means for outputting the reconverted bitstream signal as an output signal from the apparatus;

wherein the predicting means include:
means for integrating the prediction signal to obtain a pseudo audio signal;
means for extrapolating a value from the last n samples of the pseudo audio signal generated by the integrator means, where n is an integer value larger than 1; and
means for deriving a next bit value of the predicted bitstream signal from the extrapolated sample and the last sample of the pseudo audio signal generated by the integrator means.

31. A method comprising the steps of:

receiving a residual bitstream signal into an apparatus;

combining the residual bitstream signal with a predicted bitstream signal so as to obtain a reconverted bitstream signal;

predicting depending on a prediction signal to obtain the predicted bitstream signal;

outputting the reconverted bitstream signal as an output signal from the apparatus;

wherein the predicting step includes:
integrating the prediction signal to obtain a pseudo audio signal;
extrapolating a sample from the last n samples of the pseudo audio signal generated in the integration substep, where n is an integer value larger than 1; and
deriving a next bit value of the predicted bitstream signal from the extrapolated sample and the last sample of the pseudo audio signal generated in the integration substep.

32. The apparatus of claim 1, wherein:

the audio signal includes an analog audio signal;

the conversion means include A/D means for 1-bit A/D conversion of the analog audio signal into the converted 1-bit bitstream signal;

the A/D means include a sigma-delta modulator;

the predicting means predict from n sequential bits in the prediction signal, m prediction bits, the m prediction bits are predicted versions of m sequential bits in the converted 1-bit bitstream signal following the n sequential bits in the prediction signal, where n and m are integers larger than zero;

the signal combination means combine the m prediction bits with the m sequential bits in the converted 1-bit bitstream signal so as to obtain m sequential bits of the residual bitstream signal;

the signal combination means include an exor gate or an exnor gate;

the predicting means are selected from conversion table means and filtering means;

the conversion table means include means to supply $m_1$ prediction bits for a first sequence of n bits of the prediction signal and $m_2$ prediction bits for a second sequence of n bits in the prediction signal, where $m_1$ and $m_2$ are different integers;

the predicting means include calculation means for determining for a portion of the converted 1-bit bitstream signal, the sequence of m bits following the input of a predetermined sequence of n sequential bits of the prediction signal that has the highest probability of occurrence after the occurrence of the predetermined sequence of n bits in the prediction signal; and means for allocating the sequence of m bits as the m prediction bits to the predetermined sequence of n bits;

the outputting means transmits the residual bitstream signal into a transmission medium;

the outputting means transmits side information representative of the conversion table to the transmission medium;

the outputting means further comprises means for error correction encoding residual bitstream signal;

the outputting means further comprises means for channel encoding the residual bitstream signal:

the outputting means write the residual bitstream signal in a track on a record carrier; and the record carrier is an optical or a magnetic record carrier.

33. The transmitter of claim 11, wherein:

the audio signal includes an analog audio signal;

the conversion means include means for 1-bit A/D conversion of the analog audio signal into the converted 1-bit bitstream signal;

the A/D means include a sigma-delta modulator;

the predicting means predict from n sequential bits in the prediction signal, m prediction bits, the m prediction bits are predicted versions of m sequential bits in the converted 1-bit bitstream signal following the input of the n sequential bits in the prediction signal, where n and m are integers larger than zero;

the signal combination means combine the m prediction bits with the m sequential bits in the converted 1-bit bitstream signal so as to obtain m sequential bits of the residual bitstream signal;

the signal combination means include an exor gate;

the predicting means include a conversion table for supplying m prediction bits in response to a sequence of n bits from the prediction signal;

the conversion table includes means to supply $m_1$ prediction bits for a first sequence of n bits of the prediction signal and $m_2$ prediction bits for a second sequence of n bits in the prediction signal, where $m_1$ and $m_2$ are different integers;

the predicting means include: calculation means for determining for a portion of the converted 1-bit bitstream signal, the sequence of m bits following a predetermined sequence of n sequential bits of the prediction signal that has the highest probability of occurrence following the input of the predetermined sequence of n bits in the prediction signal and means for allocating the sequence of m bits as the m prediction bits to the predetermined sequence of n bits;

the transmission means apply side information representative of a conversion table to the transmission medium;

the transmitter further comprises means for error correction encoding;

the transmitter further comprises channel encoding means for channel encoding the data compressed residual bitstream signal prior to applying the residual bitstream signal to the transmission medium;

the transmission means write the residual bitstream signal in a track on a record carrier; and the record carrier is an optical or a magnetic record carrier.

34. The apparatus of claim 17, wherein:

the prediction signal is the 1-bit bitstream signal or is the residual bitstream signal;

the D/A means include a sigma-delta demodulator;

the combination means combine the m prediction bits with m bits in the residual bitstream signal to obtain the m sequential bits of the reconverted bitstream signal;

the combination means include an exor gate;

the predicting means supply m prediction bits in response to a sequence of n bits in the reconverted bitstream signal; and the conversion table includes means to supply $m_1$ prediction bits for a first sequence of n bits of the reconverted bitstream signal and $m_2$ prediction bits for a second sequence of n bits in the reconverted bitstream signal, where $m_1$ and $m_2$ are different integers.

35. An apparatus comprising:

means for providing an audio signal;

means for converting the audio signal into a converted 1-bit bitstream signal and including a sigma-delta modulator;

means for predicting depending on a prediction signal to obtain a predicted bitstream signal;

means for combining the converted 1-bit bitstream signal and the predicted bitstream signal to obtain a residual bitstream signal; and means for outputting the residual bitstream signal as an output signal from the apparatus and wherein:
  the predicting means include a conversion table with means for predicting from n sequential bits in the prediction signal, m prediction bits which are predicted versions of m sequential bits in the converted 1-bit bitstream signal following the input of the n sequential bits in the prediction signal, where n and m are integers larger than zero; and
  the conversion table supplies $m_1$ prediction bits in response to a first sequence of n bits in the prediction signal and $m_2$ prediction bits in response to a second sequence of n bits in the prediction signal, where $m_1$ and $m_2$ are different integers.

36. An apparatus comprising:

means for providing an audio signal;

means for converting the audio signal into a converted 1-bit bitstream signal;

means for predicting depending on a prediction signal to obtain a predicted bitstream signal;

means for combining the converted 1-bit bitstream signal and the predicted bitstream signal to obtain a residual bitstream signal; and means for outputting the residual bitstream signal as an output signal from the apparatus; and wherein the predicting means include:
  a predictor unit with means for predicting from n sequential bits in the prediction signal, m prediction bits which are predicted versions of m sequential bits in the converted 1-bit bitstream signal following the input of the n sequential bits in the prediction signal, where n and m are integers larger than zero;
  calculation means for determining for a portion of the converted 1-bit bitstream signal, the sequence of m bits following the input of a predetermined sequence of n sequential bits of the prediction signal, that has the highest probability of occurrence in the converted 1-bit bitstream signal after the occurrence of the predetermined sequence of n bits in the prediction signal; and
  means for allocating the sequence of m bits as the m prediction bits to the predetermined sequence of n bits.

37. The method of claim 10, wherein:

the audio signal includes an analog audio signal;

the converting includes 1-bit A/D converting the analog audio signal into the converted 1-bit bitstream signal;

the A/D converting includes a sigma-delta modulation;

the predicting includes predicting from n sequential bits in the prediction signal, m prediction bits, the m prediction bits are predicted versions of m sequential bits in the converted 1-bit bitstream signal following the n sequential bits in the prediction signal, where n and m are integers larger than zero;

the signal combining includes combining the m prediction bits with the m sequential bits in the converted 1-bit bitstream signal so as to obtain m sequential bits of the residual bitstream signal;

the signal combining includes EXOR combining or EXNOR combining;

the predicting is selected from: table converting and predictive filtering;

the table converting includes supplying m prediction bits in response to a sequence of n bits from the prediction signal;

the table converting includes supplying $m_1$ prediction bits for a first sequence of n bits of the prediction signal and $m_2$ prediction bits for a second sequence of n bits in the prediction signal, where $m_1$ and $m_2$ are different integers;

the predicting includes: calculating for determining for a portion of the converted 1-bit bitstream signal, the sequence of m bits following the input of a predetermined sequence of n sequential bits of the prediction signal that has the highest probability of occurrence after the occurrence of the predetermined sequence of n bits in the prediction signal; and allocating the sequence of m bits as the m prediction bits to the predetermined sequence of n bits;

the predictive filtering includes: integrating the prediction signal to obtain a pseudo audio signal; deriving an extrapolated sample from the last n samples of the pseudo audio signal generated in the integration substep where n is an integer value larger than 1; and deriving a next bit value of the predicted bitstream signal from the extrapolated sample and the last sample of the pseudo audio signal generated in the integration substep;

the predictive filtering includes: filtering the prediction signal supplied to its input to obtain a multi-value output signal; and quantizing the multi-value output signal to obtain the predicted bitstream signal;

the outputting includes transmitting the residual bitstream signal into a medium;

the outputting includes outputting side information representative of the conversion table;

the outputting includes error correction encoding the residual bitstream signal;

the outputting includes channel encoding the residual bitstream signal;

the transmitting includes writing the residual bitstream signal in a track on a record carrier;

the writing utilizes optical or magnetic recording methods;

the determining includes determining a probability signal depending on the predicting;

the outputting includes data compressing the residual bitstream signal by entropy encoding the residual bitstream signal in response to the probability signal to obtain a data compressed residual bitstream signal; and the method further comprises inputting a second residual bitstream signal;

the method further comprises combining the second residual bitstream signal with a second predicted bitstream signal to obtain a reconverted bitstream signal;

the method further comprises predicting depending on a second prediction signal to provide the second predicted bitstream signal;

the method further comprises D/A converting of the reconverted bitstream signal to obtain a replica of an original audio signal;

the method further comprises outputting the replica of the original audio signal as a second output from the data processor; and the inputting includes: receiving a second data compressed residual bitstream signal; and data expanding the second data compressed residual bitstream signal to obtain the second residual bitstream signal;

the second predicting is selected from: table converting and predictive filtering depending on the first predicting;

the inputting includes inputting the second residual bitstream signal from a second transmission medium;

the inputting includes inputting side information representative of the conversion table for predicting the second residual bitstream signal.

* * * * *